Sept. 19, 1961 D. A. BUCK 3,001,178

ELECTRICAL MEMORY CIRCUITS

Filed Dec. 9, 1957

2 Sheets-Sheet 1

Inventor
Dudley A. Buck
by Roberts, Cushman & Grover
Att'ys

Sept. 19, 1961

D. A. BUCK 3,001,178

ELECTRICAL MEMORY CIRCUITS

Filed Dec. 9, 1957

2 Sheets-Sheet 2

Inventor
Dudley A. Buck
by Roberts, Cushman & Grover
Attys 3,001,178
ELECTRICAL MEMORY CIRCUITS

Dudley A. Buck, North Wilmington, Mass., assignor to Arthur D. Little, Inc., Cambridge, Mass., a corporation of Massachusetts Filed Dec. 9, 1957, Ser. No. 701,503
23 Claims. (Cl. 340—173.1)

This invention relates to electrical circuits for storing information and particularly to circuits utilizing superconducting materials.

Various superconductive materials are known which are capable of a change of state from one of finite electrical resistance to one of zero resistance. For example, a body of lead cooled to 7.2 degrees Kelvin suddenly drops to zero resistance. The temperature at which superconductive materials undergo such transition is dependent on the magnetic field about the material. The critical temperature of 7.2° K. for lead supposes a zero magnetic field. As the field increases toward approximately 800 oersteds the transition temperature drops toward zero, and at intermediate temperatures there is a field which, if exceeded, will cause the lead body to change from superconducting state to a state of finite resistance. Thus for any given temperature below critical temperature there is a predetermined value of magnetic field above which lead undergoes transition from the superconducting state, and the transition between superconduction and finite resistance can be effected by varying the magnetic field respectively below and above the predetermined value. Above the critical temperature no reduction of field can restore superconduction. Herein the term superconductive is used to designate the capability of the body to change between the above-mentioned states, while superconducting or superconduction designates the zero resistance state.

In an article, The Cryotron—A Superconductive Computer Component, Proceedings of the I.R.E., vol. 44, No. 4, April, 1956, I have described a superconducting device comprising a length or gate of superconducting material, such as tantalum, on which is wound a control coil for applying a magnetic field to the gate. When the gate is below its critical temperature a sufficient current through the coil will apply a magnetic field greater than the predetermined value and change the gate from superconducting, zero resistance state to a state of finite resistance. Correspondingly, current through the gate will encounter either zero resistance or a finite resistance, and thus the cryotron gate acts as a valve.

One object of the present invention is to provide a novel memory unit utilizing the peculiar characteristics of a cryotron gate.

According to the invention an electrical memory comprises current-supply means and current-collection means, superconductors forming at least one pair of alternate paths between said current means, variable impedance means in each path, input means for maintaining one of said impedances in each pair relatively high and one relatively low, interrogation means for introducing impedance alternatively into paths of a pair whereby when said input means and interrogation means establish impedance in both paths of a pair of relatively high impedance appears across said current means.

For the purpose of illustration typical embodiments of the invention are shown in the accompanying drawings in which FIG. 1 is a plot of transition temperature against magnetic field applied to various superconductive elements;

Figure 1:
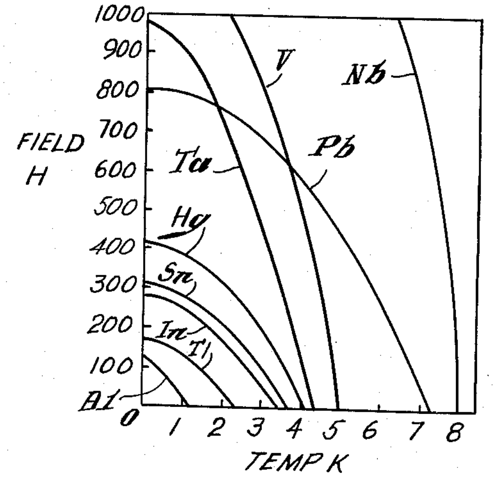

As shown in FIG. 1 various elements are capable of superconduction, depending upon the temperature and magnetic field of their environment. In this figure are shown the transition curves of aluminum (Al), thallium (Tl), indium (In), tin (Sn), mercury (Hg), tantalum (Ta), vanadium (V), lead (Pb) and niobium (Nb). For each of these elements the curve is a plot of the transition temperature as a function of the applied magnetic field. Below the curve the element is superconducting, and above the curve the element has a finite resistance usually less than the resistance at room temperature.

Figure 2:
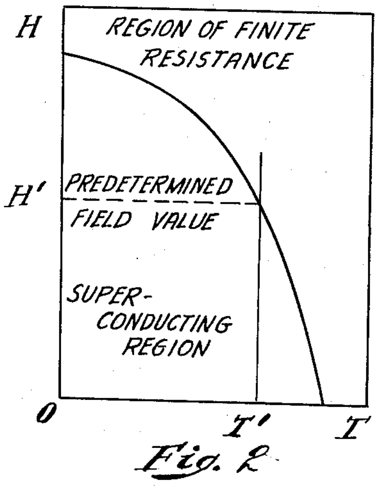
FIG. 2 is a similar plot illustrating transition of a superconductive body between states.

As shown in FIG. 2 the transition curve is the boundary between the superconducting region and finite resistance region of a given element. For a given temperature environment T' there is a predetermined magnetic field value H' at the transition point or zone. Increasing the field above the predetermined value H' destroys superconduction, while reducing the field below the predetermined value establishes superconduction.

Figure 3:
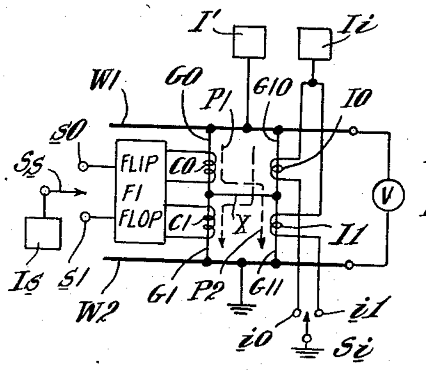
FIG. 3 is a block diagram of a memory unit.

In FIG. 3 is shown a superconductive memory unit including a cryotron flip-flop F1 having having two output control coils C0 and C1 wound on the two arms G0, G1 of a superconductor connected between two current buses W1 and W2. A second superconductor G10–G11 between the buses is connected to the first by a superconducting crossarm X. From a primary, constant current source I' current may flow to the current-supply bus W1 through the superconductors G0, G1, X, G10 and G11 along one of two paths P1 or P2 to the current-collection bus W2. Preferably the buses W1 and W2 are superconductors. The arms G10, G11 of the second superconductor are embraced respectively by interrogation control coils I0 and I1 each of which is in series with a source of interrogation current *Ii* and an interrogation switch *Si* having contacts *i0* and *i1*. The circuit W1, G0, G1, X, G10, G11, W2 is adapted to be placed in superconducting or zero-resistance state by immersion in a bath of liquid helium at approximately 4.2° K.

Figure 4:
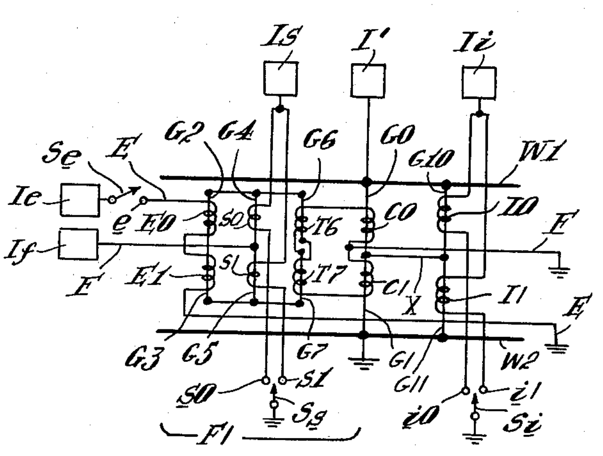
FIG. 4 is a schematic diagram of the memory unit.

The flip-flop F1, to be described more fully with reference to FIG. 4, can be set in one of two stable conditions by a set switch *Ss* having terminals *s0* and *s1* for setting a 0 condition or a 1 condition, the set switch being connected to a source of set current *Is*. It will be understood that the set switch is symbolic of any signal source capable of applying a pulse to the *s0* or *s1* terminals.

When set current is supplied to one or the other of the set terminals, the flip flop assumes a stable condition in which current flows either through control C0 or control C1. In 0 condition, for example, current in control C0 applies a field greater than the above-mentioned predetermined field, thereby changing arm G0 from zero to finite resistance. Since the flip-flop will hold its 0 condition, the primary digit, or bit, 0 is stored in the H-shaped circuit. Alternatively the bit 1 can be stored by applying a magnetic field to arm G1.

To interrogate the memory unit, the interrogate switch *Si* is thrown to contact *s0* or *s1*, thereby causing either control coil I0 or I1 to change gate G10 or G11 to resistive state. Assuming bit 0 to be stored and gate G0 in resistive state, interrogation whether bit 1 is stored, by making G11 resistive, will leave a zero resistance path P2 through gate G10, crossarm X and gate G1. A voltmeter V will then indicate no resistance between the buses W1 and W2. However, if bit 0 is interrogated by changing gate G10 to resistive state, a finite resistance across the buses will be indicated on the voltmeter V. Conversely, if bit 1 is stored and bit 0 interrogated, a zero resistance path P1 remains acros the buses. But if bit 1 is stored and interrogated, gates G1 and G11 interpose a finite resistance.

In FIG. 4 the flip-flop circuit, while not by itself a part of the present invention, is shown in connection with the H-shaped memory unit. A current source I*f* supplies flip-flop current through gates G4 and G5 respectively, to transfer control coils T7 and T6 embracing gates G7 and G6. If current is established through gate G4, for example, such current will flow through transfer coil T7, thereby applying a magnetic field to gate G7 and blocking current flow through gate G7 and therefore G5. The flip-flop is then in a stable condition in which the established current flow through the flip-flop output control coil C1. Conversely if current is first established in the path including gate G5, transfer coil T6 and output coil C0, no current will flow in the path including gate G4 and coils T7 and C1. Current is set or established through gate G4 or G5 by means of a magnetic field applied by set coil S0 or S1. A source of set current I*s* supplies current by transfer of a switch S*s* to one of two set contacts *s*0 or *s*1. After flip-flop current is set in one or the other of the described paths, the set current may be discontinued. Prior to setting the current, one or both of two enable gates G2 and G3 must be placed in resistive state by current through enable coils E0 and E1. Current for the enable coils E0 and E1, which may comprise a single coil, is supplied from a source I*e* through a switch S*e*, a contact *e* and a conductor E. If these gates are superconducting prior to setting the flip-flop, they act to shunt from its source I*f* flip-flop current which otherwise tends to flow through one of the transfer coils T6 or T7.

For example if, with the enable switch S*e* open, the set switch S*s* is thrown to contact *s*0, supplying current to control coil C, gate G4 is made resistive and diverts flip-flop current I*f* to the superconducting path through gate G5. Part of this current flows in a path through gates G3, G2, E0, G6 and coils T7 and C1, while the remainder of the flip-flop current flowing through gate G7 and coils T6 and C0 is insufficient to make gate G6 resistive and assure a particular stable condition. However, if the enable switch S*e* is closed, gates G2 and G3 are made resistive and all the flip-flop current flows through the transfer coil T6 thus establishing the stable condition previously described.

Figure 5:
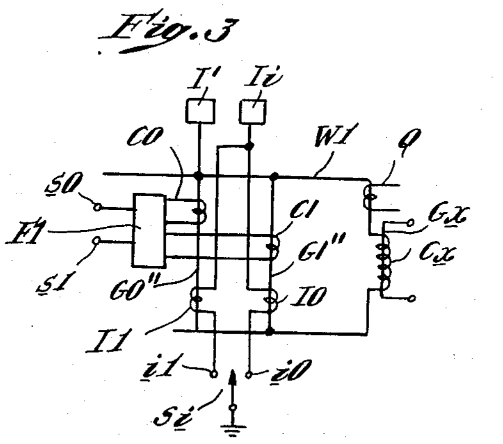
FIG. 5 is a block diagram of a further embodiment of memory unit.

As shown in FIG. 5 the storage circuit may comprise two parallel arms G0″ and G1″ extending between the buses W1 and W2. The respective paths formed by the arms G0″ and G1″ are controlled by the output coils C0 and C1 of the flip-flop F1. A set signal applied to the input terminals *s*0 and *s*1 of the flip-flop will set condition 0 or 1 by control of the arm G0″ or G1″ causing it to become resistive. With arm G0″ resistive, for example, all current will flow through the superconducting arm G1″ and no resistance will exist between the buses W1 and W2. If now, the memory is interrogated for 1 by throwing the interrogation switch S*i* to contact *i*1, additional resistance in arm G0″ is established by the coil I1, but arm G1″ remains superconducting. If, however, the interrogation is 0, the same bit as was set, coil I0 makes gate G1″ resistive. Both arms G0″ and G1″ being resistive, primary current is diverted to the control coil C*x* of an output gate G*x*. The diverted current flowing through the output coil C*x* applies a field higher than critical to the gate G*x* causing it to become resistive. The establishment of resistance in gate G*x* may be detected by a voltmeter, or the gate may be used to control current other circuits. After interrogation, current established through the superconductor forming the output coil C*x* will continue even after gate G0″ or G1″ return to superconducting state. Therefore a control coil Q is provided for quenching such established current. A short pulse applied to coil Q after interrogation will redivert the primary current I′ to the memory gates G0″ and G1″.

Figure 6:
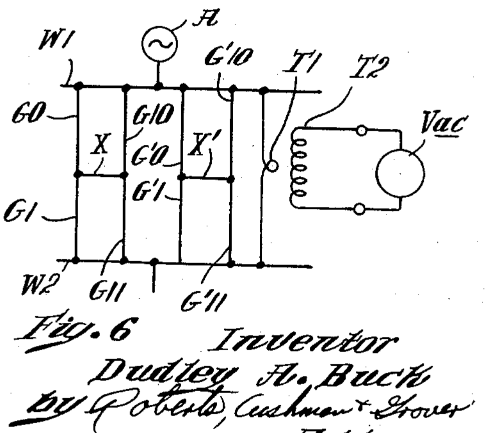
FIG. 6 is a schematic diagram showing a device for reading out from the memory unit.

In FIG. 6 is shown an alternate circuit for indicating the presence of stored information. Two H-shaped circuits X, G0–G1, G10–G11, and X′, G′0–G′1, G′10–G′11 are connected between buses W1 and W2 to which alternating current is applied by a generator A whose frequency is for example 1 to 100 kilocycles per second. Between the buses is connected the primary T1 of a transformer whose secondary T2 is connected to an alternating current voltmeter V*ac*.

Assume the binary number 00 to be stored by establishing resistance in arms G0 and G′0. Alternating current will now be distributed among the remaining superconducting paths and a voltage will not appear across the transformer primary. If the two digit memory is now asked if 00 is present by establishing resistance in arms G10 and G′10, resistance will then appear in all arms of the memory, diverting current to the transformer primary T1 which may be superconductive or resistive wire. If a superconductive primary is used, a quenching coil Q, like that shown in FIG. 5, is used to quench current diverted to the output coil T1. By way of example of a resistive primary, a copper wire of one or more turns having ten to one hundred times the normal resistance of the superconductive gates G0–G1 or G10–G11 may be used. The secondary T2, having many more turns, amplifies the voltage across the primary T1 and causes the A.C. voltmeter V*ac* to deflect when alternating current is diverted to the primary.

In the circuit of FIG. 6 a steady direct current source may be substituted for the alternating current source A, if the interrogation signal has a leading edge with a bandwidth approximately that of the transformer. For example, if the transformer T1–T2 has a bandwidth of 50 cycles per second to 20 kilocycles per second, an interrogation pulse with a leading edge within that bandwidth will cause a change of current through the primary T1 which will be amplified in the secondary T2.

Figures 7, 8:
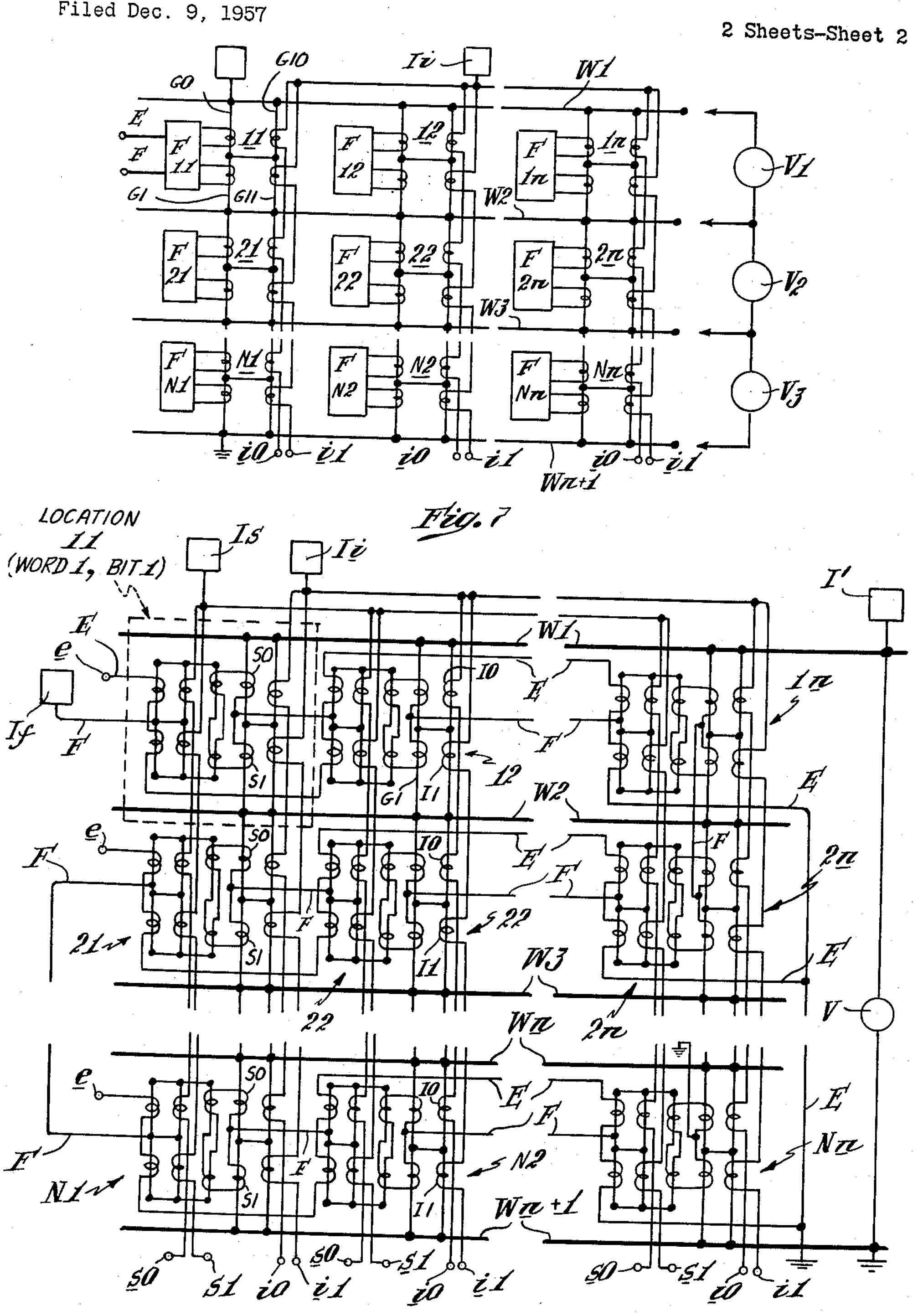
FIG. 7 is a block diagram of a memory matrix embodying a plurality of units.
FIG. 8 is a schematic diagram of the memory matrix.

As shown in FIGS. 7 and 8 the memory circuits of FIGS. 3 to 6 are particularly well adapted as one unit or location in a large memory matrix. While the H-shaped storage unit of FIGS. 3, 4 and 6 is illustrated, the unit G0′–G1″ of FIG. 5 may also be used.

The matrix comprises a plurality of units arranged in parallel series. Each horizontal series of location represents a numerical word having *n* digits. The top series or word 1 includes locations 11, 12 to 1*n*, the second series or word 2 includes locations 21, 22 to 2N, and so on to the last series, word N with locations N1, N2 to N*n*. For convenience, the first digit of each location identifies the word, and the second digit identifies the bit of a word. For example, location 12 represents bit 2 of word 1. Flip-flops F11 to FN*n* are associated with the like numbered locations. A source of primary current I′ is connected across the buses W1, W2 to W*n*+1 which are interconnected by the storage units of the several locations.

For each word, the enable conductor is a single wire E extending from a terminal *e* successively through each location of the word. Flip-flop current is supplied from a source I*f* through conductors F connecting all the flip-flops of each word in series.

The set coils S0 or S1 for the 1st, 2nd or *n*th digit of several words are connected in series between a set current supply I*s* and set terminals *s*0 and *s*1 respectively. Similarly the interrogate coils I0 or I1 are connected in series with interrogate terminals *i*0 or *i*1.

Thus according to the invention, all the flip-flops of each word may be enabled by supplying enable current to the terminal *e* for that word. In contrast the same, e.g. *n*th, location of all words is supplied with set current from one pair of set terminals $s0$–$s1$. For example, to set the bit "one" in location 12, the enable terminal $e$ for word 1 is energized, and simultaneously the terminal $i1$ for the 2nd location of all words is supplied with set current. Words 2 and N, not being enabled, will not be affected by current through their set coils. However, word 1, bit 2, being both enabled and set, will store the digit 1 by control of its gate G1 as described with reference to FIG. 3. By successively energizing the several pairs of set terminals $s0$–$s1$, bits "one" or "zero" may be stored or written in each location of a word. The words are written successively, by progressive energization of the several enable terminals $e$.

All the words of the memory matrix of FIGS. 7 and 8 may be interrogated simultaneously by simultaneous supply of current in steady or pulse form to all the pairs $i0$–$i1$ of interrogate terminals.

For example, suppose that the code information 100, 110 and 111 are written in words 1, 2 and N, by setting the digit one in location 11, the digit zero in location 12, the digit zero in location 1N and so on. Further suppose that the memory is first asked whether 000 is stored, and second whether 100 is stored.

On the first interrogation, 000, some of the paths between the buses will be resistive since both gate G0 and gate G10 will be held in resistive state respectively, by flip-flop control and interrogate coil control. However, the first digit of each word, for example, will have gates G0 and G11 in superconducting, zero resistance state, so that no voltage drop appears between any adjacent two buses W1, W2, etc.

On the second interrogation, 100, gates G1 and G11 of location 11 and gates G0 and G10 of locations 12 and 1$n$ will be resistive, so that in general word 1 of the memory is resistive and a finite resistance exists between buses W1 and W2. With separate voltmeters V1, V2 and V3 connected across adjacent pairs of buses, as shown in FIG 7, voltmeter V1 will register a finite resistance indicating that the interrogated word 100 is stored in the locations of word 1 of the memory.

If, as shown in FIG. 8, only one voltmeter V is connected between bus W1 and W$n$+1, the establishing by interrogation of resistance in all the locations of a word places a resistance across one adjacent pair of buses but not across the other buses of the matrix. Still a resistance will exist across buses W1 and W$n$+1. Accordingly, the meter V will indicate that the interrogated word is stored in the matrix, but will not identfiy the location in which it is stored.

It should be understood that a superconductive wire such as the superconductor G0 between bus W1 and crossarm X comprises both a circuit connection there between and a cryotron value or variable impedance at the portion on which the control coil C0 is wound.

It will further be understood that the present invention includes other modifications and equivalents falling within the appended claims.

I claim:

1. An electrical memory comprising current-supply means and current-collection means, superconductors forming at least one pair of alternate magnetically independent paths between said current means, variable impedance means in each path, input means for maintaining one of said impedances in each pair relatively high and one relatively low, and interrogation means for introducing impedance alternatively into paths of a pair, whereby when said input means and interrogation means establish impedance in both paths of a pair a relatively high impedance appears across said current means.

2. An electrical memory comprising current-supply means and current-collection means, superconductors forming at least one pair of alternate magnetically independent paths between said means, output terminals at the common ends of said paths, variable impedance means in each path, input means for maintaining one of said impedances in each pair relatively high and one relatively low, and interrogation means for introducing impedance alternatively into the paths of a pair, whereby when said input means and interrogation means establish impedance in both paths of a pair a relatively high impedance appears across said output terminals.

3. An electrical memory comprising current-supply means, current-collecting means, superconductive means forming two magnetically independent paths between said means, said superconductive means being responsive to a predetermined magnetic field to change between a zero resistance state and a state of finite resistance, for each path a first control means for applying a magnetic field to said superconductive means, and for each path second control means for applying a magnetic field alternatively to said respective paths whereby when one path is held in finite resistance state, such conditions can be identified by the application by said second control means of a magnetic field to the other path, thereby to establish a finite resistance between said current-supply and current-collection means.

4. An electrical memory comprising current-supply means and current-collection means, superconductors forming at least one pair of alternate magnetically independent paths between said current means, variable impedance means in each path, input means for maintaining one of said impedances in each pair relatively high and one relatively low, interrogation means for introducing impedance alternatively into paths of a pair, whereby when said input means and interrogation means establish impedance in both paths of a pair a relatively high impedance appears across said current means, and output means connected across said current means to which current is diverted when said high impedance appears across said current means.

5. An electrical memory comprising current-supply means, current-collecting means, superconductive means forming two magnetically independent paths between said means, said superconductive means being responsive to a predetermined magnetic field to change between a zero resistance state and a state of finite resistance, for each path input control means for applying a magnetic field to said superconductive means, write-in means for establishing current alternatively in the input control means for one path of a pair thereby to change said one path to finite resistance state, for each respective path of a pair interrogation control means for applying a magnetic field alternatively to one of said respective paths, whereby when one path is held in finite resistance state by said write-in means, such condition can be identified by the application by said interrogation control means of a magnetic field to the other path thereby to establish a finite resistance between said current-supply and current-collection means, and means for indicating said identity comprising a conductor connected between said current means to shunt said paths, said conductor including electromagnetic output means, whereby when said paths are resistive, current is diverted from said paths to said conductor thereby to energize said electro-magnetic output means.

6. An electrical memory according to claim 4 wherein said output means comprises an electromagnetic device.

7. An electrical memory according to claim 4, wherein said output means comprises a transformer primary.

8. An electrical memory according to claim 4 wherein said output means comprises a cryotron including a superconductive gate and a control therefor connected between said current means in series with a cryotron.

9. An electrical memory according to claim 4 characterized by an indicator connected to said output means.

10. An electrical memory comprising at least three parallel current-supply means and current-collection means, conductors forming a plurality of pairs of alternate paths between adjacent pairs of said current means, variable impedance means in each path, input means for maintaining one of said impedances in each pair relatively high and one relatively low, interrogation means for introducing impedance alternatively into paths of a pair, whereby when said input means and interrogation means establish impedance in both pairs of a pair a relatively high impedance appears across said current means, said interrogation means comprising at least one conductor disposed to control paths between two pairs of said current means.

11. An electrical memory comprising at least three parallel current-supply means and current-collection means, super-conductors forming a plurality of pairs of alternate paths between adjacent pairs of said current means, variable impedance means in each path, input means for maintaining one of said impedances in each pair relatively high and one relatively low, interrogation means for introducing impedance alternatively into paths of a pair, whereby when said input means and interrogation means establish impedance in both paths of a pair a relatively high impedance appears across said current means, said interrogation means comprises a plurality of electromagnetic means respectively controlling a superconductor in one path of each of said pairs of paths, said electromagnetic means being connected in a series, so that a plurality of pairs may be interrogated simultaneously.

12. An electrical memory comprising current-supply means, current-collecting means, superconductive means forming a plurality of pairs of paths between said means, said superconductive means being responsive to a predetermined magnetic field to change between a zero resistance state and a state of finite resistance, for each path of a pair a first control means for applying a magnetic field to said superconductive means, bistable means for establishing current alternatively in said first control means thereby to change one of said paths to finite resistance state, for each path second control means for applying a magnetic field alternatively to said respective paths, whereby when one path of each pair is held in finite resistance state by said bistable means, such condition can be identified by the application by said second control means of a magnetic field to the other path of each thereby to establish a finite resistance between said current-supply and current collection means, and an enable conductor connected to render effective all bistable means controlling the pairs of paths between said current means.

13. An electrical memory comprising current-supply means, current-collecting means, superconductive means forming a plurality of pairs of paths between said means, said superconductive means being responsive to a predetermined magnetic field to change between a zero resistance state and a state of finite resistance, for each path of a pair a first control means for applying a magnetic field to said superconductive means, bistable means for establishing current alternatively in one first control means for a pair thereby to change one path of a pair to finite resistance state, for each respective path of a pair second control means for applying a magnetic field alternatively to said respective paths, whereby when one path of each pair is held in finite resistance state by said bistable means, such condition can be identified by the application by said second control means of a magnetic field to the other path of each thereby to establish a finite resistance between said current-supply and current-collection means, each of said bistable means comprising a set cryotron, a superconductive shunt in parallel therewith to disable the cryotron, and an electromagnetic control means for the shunt to enable said set cryotron, all shunt control means for paths between said current means being connected in series, whereby all the cryotrons of the bistable means may be enabled simultaneously.

14. A superconductive electrical memory comprising at least three current-supply and current-collection means, between each adjacent two current means a plurality of locations, each location comprising superconductors connected between said two current means and forming a pair of superconductive paths, said superconductors being responsive to a predetermined magnetic field to change from superconducting, zero resistance state to a state of finite resistance, for each location a bistable device including two output inductive means disposed alternatively to apply said predetermined magnetic field to superconductors in said respective paths, said locations forming a word-series between each adjacent pair of current means and a place-series extending through the same bit of each of the several word-series, interrogation means comprising two interrogation inductive means for each location, each interrogation inductive means controlling one path of each location, and one induction means of each interrogation means in a place-series being connected in series with one inductive means of each other interrogation inductive means in the same series, so that the same location of all words may be interrogated simultaneously.

15. A superconductive electrical memory comprising at least three current-supply and current-collection means, between each adjacent two current means a plurality of locations, each location comprising superconductors connected between said two current means and forming a pair of superconductive paths, said superconductors being responsive to a predetermined magnetic field to change from superconducting, zero resistance state to a state of finite resistance, for each location a bistable device including two output inductive means disposed alternatively to apply said predetermined magnetic field to superconductors in said respective paths, and said device including two set cryotrons for selecting one of said output inductive means, and a shunt cryotron for disabling said set cryotrons, said locations forming a word-series between each adjacent pair of current means and a place-series extending through the same bit of each of the several word series, the shunt cryotrons for all locations of a word-series being connected in series and one set cryotron of a place-series being connected in series with one set cryotron for the same bit in each other word, so that a single location may be selected by applying current to enable cryotrons of one word and the set cryotron of one place-series, interrogation means comprising two interrogation inductive means for each location, each interrogation inductive means controlling one path of each location, and one inductive means of each interrogation means in a place-series being connected in series with one inductive means of each other interrogation inductive means in the same series, so that the same location of all words may be interrogated simultaneously.

16. A cryotron catalog memory comprising current-supply and current-collection means, superconductive means forming at least three magnetically independent paths between said current means, means for rendering resistive each of said paths, and a single means connected to detect the presence or absence of superconduction in all of said paths simultaneously between said current means.

17. A cryotron catalog memory comprising current-supply and current-collection means, superconductive means forming a plurality of magnetically independent paths between said current means, said superconductive means being responsive to a predetermined field to change between a zero resistance state and a state of finite resistance, interrogation means for rendering resistive each of said paths, and a single means connected to detect the presence or absence of superconduction in all of said paths simultaneously between said current means, each of said paths having at least one storage location and at least one of said locations being resistive prior to operation of said rendering means, said rendering means being capable of rendering all the remaining locations resistive.

18. A cryotron catalog memory comprising current-supply and current-collection means, superconductive means forming at least three magnetically independent paths between said current means, said superconductive means being responsive to a predetermined field to change between a zero resistance state and a state of finite resistance, a plurality of conductors for carrying current and disposed to apply said predetermined field to each of said paths, and a single means connected to detect the presence or absence of superconduction in all of said paths simultaneously between said current means.

19. A catalog cryotron memory comprising at least three superconductive current means including current-supply and current-collection means, superconductive means forming a plurality of magnetically independent paths between adjacent pairs of said current means, means for rendering resistive each of the paths, and means for detecting the presence or absence of superconduction in said paths between said current means.

20. A memory according to claim 19 wherein said detecting means is connected to detect the presence or absence of superconduction between the first and last of said current means.

21. A memory according to claim 19 wherein said rendering means comprises a plurality of control conductors disposed to apply magnetic fields to selected paths.

22. A memory according to claim 19 wherein a single control conductor is disposed to apply a magnetic field to paths between at least two adjacent pairs of current means.

23. A cryotron catalog memory comprising a plurality of superconductive gate paths connected in parallel to form a composite conductor, a source connected to pass an electric current through said composite conductor, a plurality of control current paths, each of said control paths being in relatively close magnetic proximity to a plurality of portions of gate paths, whereby current through a control path may render resistive the gate portions in close proximity thereto to the exclusion of the remaining gate path portions, and output means responsive to the presence or absence of superconductivity through said composite conductor.

References Cited in the file of this patent

UNITED STATES PATENTS 2,832,897 Buck ------------------ Apr. 29, 1958

OTHER REFERENCES

"The Cryotron—A Superconductive Computer Component," by D. A. Buck, Proceedings of the IRE, April 1956, pp. 482 to 493.

"A Cryoton Catalog Memory System," by A. E. Slade and H. O. McMakon. Proceedings of the Eastern Joint Computer Conference, Dec. 10, 1956 (pp. 115–119).